US010741700B2

(12) United States Patent
Yamaguchi et al.

(10) Patent No.: US 10,741,700 B2
(45) Date of Patent: Aug. 11, 2020

(54) SEMICONDUCTOR DEVICE

(71) Applicant: Mitsubishi Electric Corporation, Tokyo (JP)

(72) Inventors: Yutaro Yamaguchi, Tokyo (JP); Masatake Hangai, Tokyo (JP); Koji Yamanaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/604,092

(22) PCT Filed: May 18, 2017

(86) PCT No.: PCT/JP2017/018676
§ 371 (c)(1),
(2) Date: Oct. 9, 2019

(87) PCT Pub. No.: WO2018/211661
PCT Pub. Date: Nov. 22, 2018

(65) Prior Publication Data
US 2020/0152803 A1    May 14, 2020

(51) Int. Cl.
*H01L 29/812* (2006.01)
*H01L 29/06* (2006.01)
*H01L 29/423* (2006.01)

(52) U.S. Cl.
CPC ...... *H01L 29/8124* (2013.01); *H01L 29/0692* (2013.01); *H01L 29/42376* (2013.01)

(58) Field of Classification Search
None
See application file for complete search history.

(56) References Cited

U.S. PATENT DOCUMENTS

| | | | |
|---|---|---|---|
| 5,834,802 A * | 11/1998 | Takahashi | H01L 21/28587 257/280 |
| 7,304,331 B2 * | 12/2007 | Saito | H01L 29/1066 257/187 |
| 8,203,185 B2 * | 6/2012 | Sriram | H01L 29/42316 257/369 |
| 2011/0233559 A1 | 9/2011 | Ishikura | |
| 2013/0026550 A1 * | 1/2013 | Yoshioka | H01L 29/0619 257/296 |
| 2013/0127538 A1 * | 5/2013 | Murakami | H03F 1/523 330/277 |
| 2018/0130888 A1 * | 5/2018 | Bielunis | H01L 29/4238 |

FOREIGN PATENT DOCUMENTS

| | | |
|---|---|---|
| JP | 6-151471 A | 5/1994 |
| JP | 8-45961 A | 2/1996 |
| JP | 2011-204984 A | 10/2011 |

OTHER PUBLICATIONS

Imai et al., "An 80-W Packaged GaN High Power Amplifier for CW Operation in the 13.75-14.5 GHz band", Microwave Symposium (IMS), 2014 IEEE MTT-S International, total of 4 pages.

* cited by examiner

*Primary Examiner* — Thien F Tran
(74) *Attorney, Agent, or Firm* — Birch, Stewart, Kolasch & Birch, LLP (57) ABSTRACT

Gate fingers (2-1 to 2-6) are arranged in one direction and each of the gate fingers is disposed so as to be adjacent to a corresponding one of drain electrodes (3-1 to 3-3) and a corresponding one of source electrodes (4-1 to 4-4) alternately, and have non-uniform gate head lengths.

5 Claims, 4 Drawing Sheets

FIG. 8

SEMICONDUCTOR DEVICE

TECHNICAL FIELD

The present invention relates to a semiconductor device, for example, used for a high frequency power amplifier, such as a field effect transistor.

BACKGROUND ART

A multi-finger transistor includes a plurality of strip-shaped source electrodes, a plurality of strip-shaped gate electrodes, and a plurality of strip-shaped drain electrodes, and the source electrodes, the gate electrodes, and the drain electrodes are alternately arranged (see, for example, Patent Literature 1). The multi-finger transistor also includes a gate routing line extending from one end portion of the transistor through a center portion thereof to the other end portion. By supplying power to an input point at a center portion of the gate routing line, power is distributed to each of the plurality of gate electrodes by the gate routing line.

CITATION LIST

Patent Literatures

Patent Literature 1: JP 2011-204984 A

SUMMARY OF INVENTION

Technical Problem

In the multi-finger transistor described in Patent Literature 1, there is a difference between a distance from a gate electrode disposed adjacent to a center portion of the transistor to an input point and a distance from a gate electrode disposed at an end portion of the transistor to the input point. For this reason, power input to a plurality of gate electrodes by a gate routing line is unbalanced.

If the power input to the plurality of gate electrodes is unbalanced, an RF drain current is high at a center portion of the transistor and low at an end portion of the transistor. As a result, a difference between output terminal impedances occurs in the respective plurality of transistor structures each including a source electrode, a gate electrode, and a drain electrode, and efficiency of an amplifier using the multi-finger transistor is deteriorated disadvantageously.

The present invention solves the above disadvantage, and an object of the present invention is to obtain a semiconductor device capable of reducing a variation in output terminal impedances.

Solution to Problem

A semiconductor device according to the present invention includes: a plurality of drain electrodes; a plurality of source electrodes, a plurality of gate electrodes that are arranged in one direction and each of which is disposed so as to be adjacent to a corresponding one of the drain electrodes and a corresponding one of the source electrodes alternately; and a gate routing line disposed in the direction in which the gate electrodes are arranged, and connected to the plurality of gate electrodes. In this configuration, the plurality of gate electrodes is arranged in the one direction, each of the gate electrodes is disposed so as to be adjacent to the corresponding one of the drain electrodes and the corresponding one of the source electrodes alternately, and the gate electrodes have non-uniform gate head lengths.

Advantageous Effects of Invention

According to the present invention, by making the gate head lengths of the plurality of gate electrodes non-uniform, it is possible to make RF drain currents uniform and to reduce a variation in output terminal impedances.

DESCRIPTION OF EMBODIMENTS

Hereinafter, in order to describe the present invention in more detail, embodiments for carrying out the present invention will be described with reference to the attached drawings.

First Embodiment

Figure 1:
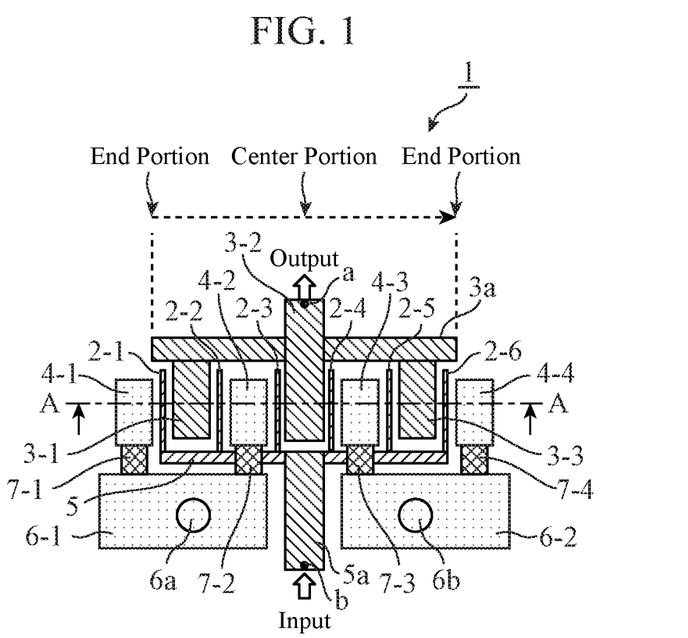
FIG. 1 is a top view illustrating a pattern layout of a semiconductor device according to a first embodiment of the present invention.
Figure 2:
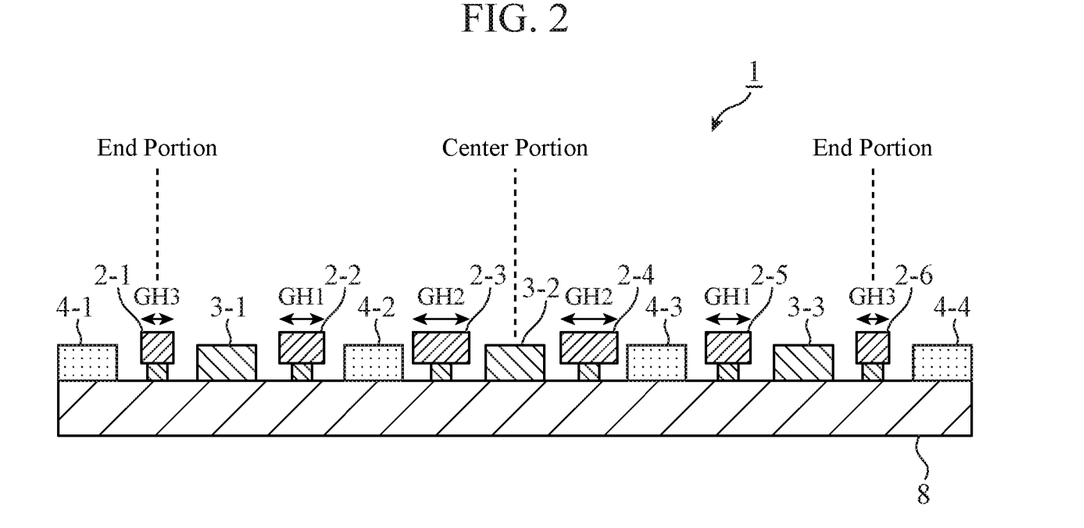
FIG. 2 is a cross-sectional view illustrating a configuration of the semiconductor device according to the first embodiment.

FIG. 1 is a top view illustrating a pattern layout of a semiconductor device 1 according to a first embodiment of the present invention. FIG. 1 illustrates a multi-finger transistor which is the semiconductor device 1. FIG. 2 is a cross-sectional view illustrating a configuration of the semiconductor device 1 according to the first embodiment, and illustrates a cross section of the semiconductor device 1 taken along line A-A in FIG. 1. As illustrated in FIG. 1, the semiconductor device 1 includes gate fingers 2-1 to 2-6, drain electrodes 3-1 to 3-3, source electrodes 4-1 to 4-4, and a gate routing line 5. The gate fingers 2-1 to 2-6 are strip-shaped gate electrodes arranged in one direction.

The gate finger 2-1 is disposed so as to be adjacent to the drain electrode 3-1 and the source electrode 4-1, and the gate finger 2-2 is disposed so as to be adjacent to the drain electrode 3-1 and the source electrode 4-2. The gate finger 2-3 is disposed so as to be adjacent to the drain electrode 3-2 and the source electrode 4-2, and the gate finger 2-4 is disposed so as to be adjacent to the drain electrode 3-2 and the source electrode 4-3. The gate finger 2-5 is disposed so as to be adjacent to the drain electrode 3-3 and the source electrode 4-3, and the gate finger 2-6 is disposed so as to be adjacent to the drain electrode 3-3 and the source electrode 4-4.

As described above, each of the gate fingers 2-1 to 2-6 is disposed so as to be adjacent to the corresponding drain electrode and the corresponding source electrode alternately to form a comb-shaped electrode structure.

Note that the semiconductor device 1 illustrated in FIGS. 1 and 2 includes six transistor structures each including a gate finger, a drain electrode, and a source electrode.

Hereinafter, this transistor structure is referred to as a finger structure.

The drain electrodes 3-1 to 3-3 are strip-shaped electrodes formed in a comb shape from a line 3a. The line 3a is a line extending in a direction in which the gate fingers 2-1 to 2-6 are arranged. The drain electrode 3-2 extends in a direction orthogonal to the line 3a, and an end portion thereof is an output point a. As illustrated in FIG. 1, the drain electrode 3-2 is located at a center portion of the line 3a, and the multi-finger transistor which is the semiconductor device 1 is formed symmetrically with respect to the center portion as a boundary. Hereinafter, the center portion is referred to as a transistor center portion, and both end portions are referred to as transistor end portions.

The gate routing line 5 is a line extending in a direction in which the gate fingers 2-1 to 2-6 are arranged as surrounded by the broken line in FIG. 1, and is connected to the individual gate fingers 2-1 to 2-6. A line 5a extending in the opposite direction to the gate fingers 2-1 to 2-6 is connected to a position corresponding to the transistor center portion in the gate routing line 5, and an end portion of the line 5a is an input point b.

Power input to the input point b is distributed to the gate fingers 2-1 to 2-6 by the gate routing line 5.

Each of the source electrodes 4-1 to 4-4 is a strip-shaped electrode disposed so as to be adjacent to the corresponding one or two of the gate fingers 2-1 to 2-6.

A source pad 6-1 is an electrode pad disposed on one side with respect to the transistor center portion as a boundary so as to be adjacent to the line 5a. A source pad 6-2 is an electrode pad disposed on the other side with respect to the transistor center portion as a boundary so as to be adjacent to the line 5a.

The source electrode 4-1 is connected to the source pad 6-1 by an air bridge 7-1, and the source electrode 4-2 is connected to the source pad 6-1 by an air bridge 7-2. The source electrode 4-3 is connected to the source pad 6-2 by an air bridge 7-3, and the source electrode 4-4 is connected to the source pad 6-2 by an air bridge 7-4.

The source pad 6-1 is electrically connected to a semiconductor layer 8 by a via hole 6a, and the source pad 6-2 is electrically connected to the semiconductor layer 8 by a via hole 6b.

The gate fingers 2-1 to 2-3 are disposed on one side (left side in FIG. 2) with respect to the transistor center portion as a boundary, and the gate fingers 2-4 to 2-6 are disposed on the other side (right side in FIG. 2) with respect to the transistor center portion as a boundary. Each of the gate fingers 2-1 to 2-6 has a T-shaped gate head structure as illustrated in FIG. 2.

The gate finger 2-2 and the gate finger 2-5 each have a gate head length of GH1, and the gate finger 2-3 and the gate finger 2-4 each have a gate head length of GH2. Furthermore, the gate finger 2-1 and the gate finger 2-6 each have a gate head length of GH3. GH2 is longer than GH1, and GH3 is shorter than GH1.

In a conventional multi-finger transistor, all of the gate fingers 2-1 to 2-6 illustrated in FIGS. 1 and 2 have the same gate head length. Therefore, unbalanced power input to each of the gate fingers 2-1 to 2-6 by the gate routing line 5 is amplified as it is, and thus RF drain currents are unbalanced in a direction indicated by the broken line arrow in FIG. 1.

In this way, when the RF drain currents are unbalanced among the six respective finger structures, a difference between output terminal impedances in the six respective finger structures is also generated.

As a result, a difference between an output terminal impedance of a finger structure and an optimum impedance with maximum efficiency of the transistor is large, and therefore, for example, efficiency of a high frequency power amplifier using a multi-finger transistor is deteriorated.

Meanwhile, in the semiconductor device 1, the gate head length of each of the gate fingers 2-1 and 2-6, the gate head length of each of the gate fingers 2-2 and 2-5, and the gate head length of each of the gate fingers 2-3 and 2-4 are different from one another and non-uniform. In particular, each of the gate fingers 2-1 to 2-6 has a longer gate head length as it is closer to the transistor center portion, and a shorter gate head length as it is closer to any one of the transistor end portions.

In FIG. 2, the gate head length GH2 of the gate finger 2-3 adjacent to the transistor center portion is the longest, the gate head length GH1 of the gate finger 2-2 adjacent thereto is the second longest, and the gate head length GH3 of the gate finger 2-1 at the transistor end portion is shorter than GH1. The same applies to the gate fingers 2-4 to 2-6.

When all the gate head lengths of the conventional multi-finger transistor are constantly GH1, in the semiconductor device 1, an average value of the gate head lengths of the gate fingers 2-1 to 2-6 is set to GH1. That is, the average value of the gate head lengths is (GH1+GH2+GH3)× $\frac{2}{6}$=GH1.

The finger structure at the transistor center portion includes the gate fingers 2-3 and 2-4 having long gate head lengths, and therefore has the largest gate-source capacitance Cgs and the largest gate-drain capacitance Cgd. Since each of the gate fingers has a shorter gate head length as it is closer to any one of the transistor end portions, the gate-source capacitance Cgs and the gate-drain capacitance Cgd in the corresponding finger structure gradually decrease. As a result, an imbalance in the input terminal impedances among the six respective finger structures is absorbed, and the input terminal impedances in all the finger structures are uniform.

When the input terminal impedances are uniform, the RF drain currents output from the respective six finger structures also are uniform to reduce a difference between output terminal impedances in the respective finger structures. Therefore, deterioration in efficiency of the high frequency power amplifier using the semiconductor device 1 can be suppressed.

In addition, when the average value of the gate head lengths of the gate fingers 2-1 to 2-6 is GH1, the semiconductor device 1 can maintain the same gain as the conventional multi-finger transistor in which all the gate head lengths are GH1.

The above effect of the semiconductor device 1 was verified using a commercially available microwave circuit simulator.

Figure 3:
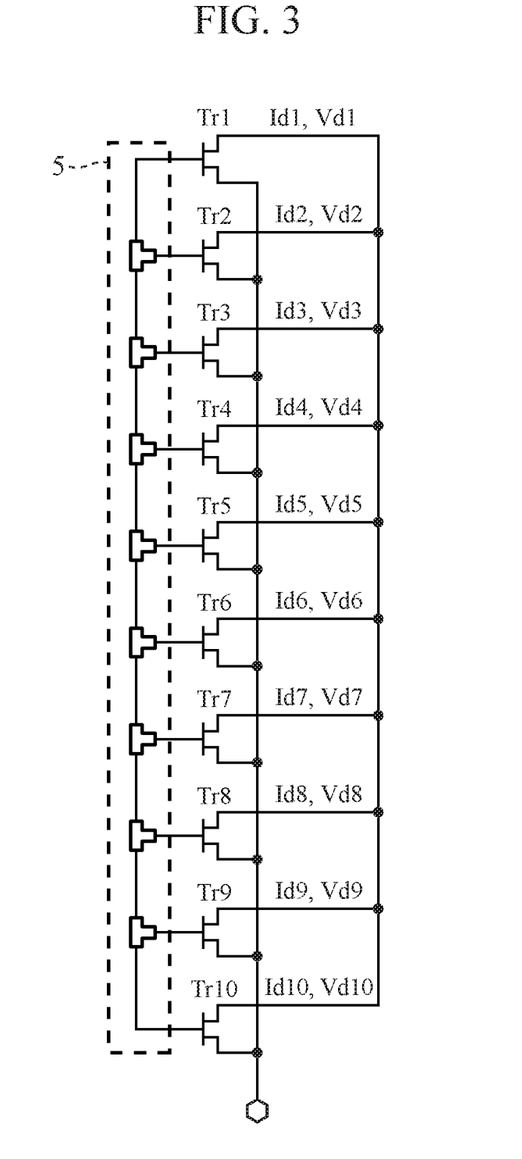
FIG. 3 is a diagram illustrating a verification model of the semiconductor device according to the first embodiment.

FIG. 3 is a diagram illustrating a verification model of the semiconductor device according to the first embodiment. The verification model illustrated in FIG. 3 models a multi-finger transistor structure by combining 10 finger transistor models Tri (i=1 to 10) with a line component model prepared in the microwave circuit simulator. The finger transistor model Tri is a large signal equivalent circuit model modeling a finger structure having a gate finger length of 40 μm. In the verification model, a portion surrounded by the broken line 5 corresponds to the gate routing line 5.

An RF drain current output from a transistor of the finger transistor model Tri is represented by Idi (i=1 to 10), and an RF drain voltage is represented by Vdi (i=1 to 10).

In the finger transistor model Tri, a gate-source capacitance Cgsi (i=1 to 10) is defined as ai×Cgsi, and a gate-drain capacitance Cgdi (i=1 to 10) is defined as ai×Cgd0. ai is a coefficient representing the degree of non-uniformity of Cgs and Cgd due to non-uniformity of the gate head lengths. Cgd0 is a fixed value of the gate-drain capacitance.

In the conventional multi-finger transistor, a1=a2=a3= . . . =a10=1, and the gate head lengths of all the finger transistor models Tri are uniform.

Hereinafter, the conventional multi-finger transistor in which ai=1 is referred to as a structure S1.

In the multi-finger transistor which is the semiconductor device 1, a1=0.9, a2=0.95, a3=1, a4=1.05, a5=1.1, a6=1.1, a7=1.05, a8=1, a9=1.05, and a10=1.1. As a result, Cgs and Cgd in the finger transistor model Tri are non-uniform.

Hereinafter, the multi-finger transistor which is the semiconductor device 1 is referred to as a structure S2.

Figure 4:
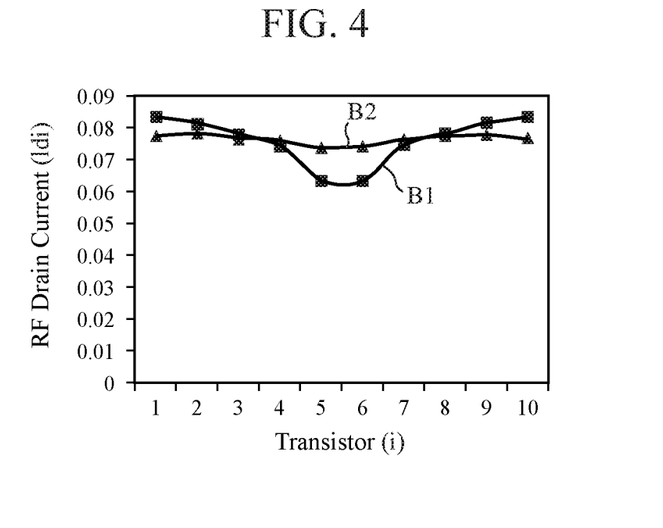
FIG. 4 is a graph illustrating a relationship between each of ten finger transistor models and an RF drain current.

FIG. 4 is a graph illustrating a relationship between each of ten finger transistor models Tri and an RF drain current Idi. In FIG. 4, the RF drain current Idi is a result of calculation using 28 GHz as a signal frequency, 20 mA as a bias drain current, 24 V as a bias drain voltage, a source impedance as a gain matching point, and a load impedance as an efficiency matching point in the verification models of the structures S1 and S2. A calculation result B1 of the RF drain current Idi was obtained by the verification model of the structure S1, and a calculation result B2 of the RF drain current Idi was obtained by the verification model of the structure S2.

In the calculation result B1 of the RF drain current Idi, the RF drain current Idi of the finger transistor model Tri (i=5, 6) at the transistor center portion is low. The RF drain current Idi of the finger transistor model Tri (i=1, 10) at each of the transistor end portions is high.

In this way, the conventional multi-finger transistor has an imbalance in the RF drain currents among the respective finger transistor models.

Meanwhile, in the calculation result B2 of the RF drain current Idi, as illustrated in FIG. 4, the RF drain current Idi is substantially uniform in all the finger transistor models.

That is, in the multi-finger transistor which is the semiconductor device 1, an imbalance in RF drain currents among the respective finger transistor models is alleviated.

Figure 5A:
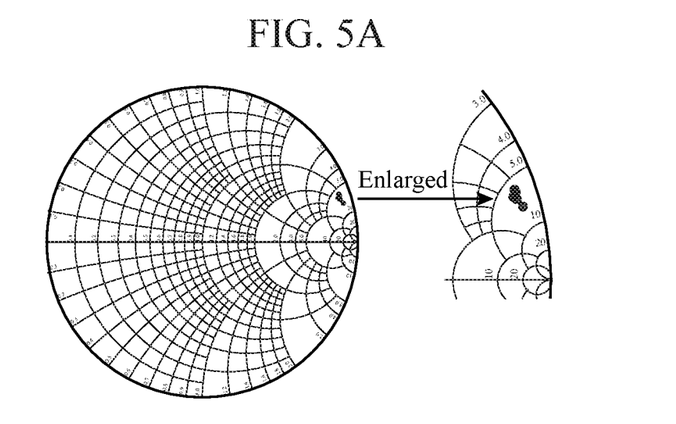
FIG. 5A is a chart illustrating an output terminal impedance of a conventional semiconductor device.
Figure 5B:
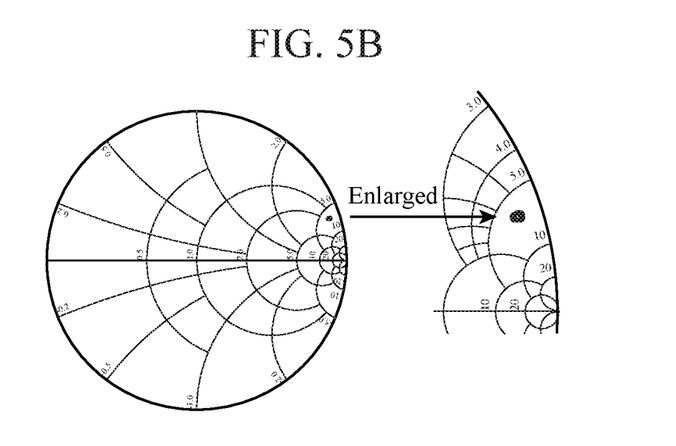
FIG. 5B is a chart illustrating an output terminal impedance of the semiconductor device according to the first embodiment.

FIG. 5A is a chart illustrating an output terminal impedance obtained by the verification model of the structure S1, and FIG. 5B is a chart illustrating an output terminal impedance obtained by the verification model of the structure S2. In FIGS. 5A and 5B, the output terminal impedance is Vdi/Idi (i=1 to 10). In the conventional multi-finger transistor, as illustrated in the enlarged chart in FIG. 5A, the values of Vdi/Idi (i=1 to 10) do not converge to one, and there is a variation. In the multi-finger transistor which is the semiconductor device 1, as illustrated in the enlarged chart in FIG. 5B, the values of Vdi/Idi (i=1 to 10) converge to one.

Figure 6A:
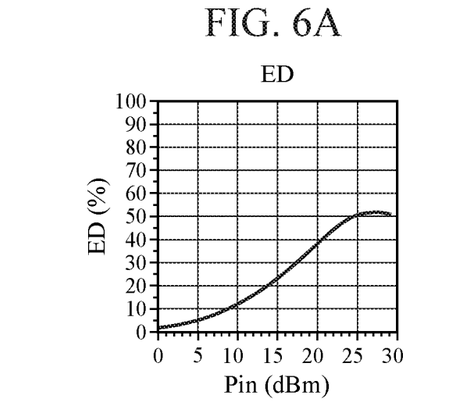
FIG. 6A is a graph illustrating drain efficiency of the conventional semiconductor device.
Figure 6B:
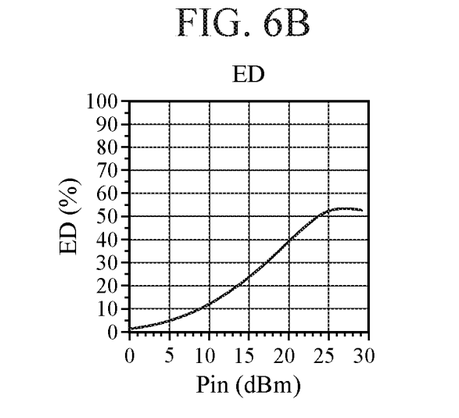
FIG. 6B is a graph illustrating drain efficiency of the semiconductor device according to the first embodiment.

FIG. 6A is a graph illustrating drain efficiency obtained by the verification model of the structure S1. FIG. 6B is a graph illustrating drain efficiency obtained by the verification model of the structure S2.

In FIGS. 6A and 6B, a peak value of drain efficiency ED (%) with respect to input power Pin obtained by the verification model of the structure S2 is about 2 points higher than that obtained by the verification model of the structure S1.

As described above, the semiconductor device 1 according to the first embodiment includes the drain electrodes 3-1 to 3-3, the source electrodes 4-1 to 4-4, the gate fingers 2-1 to 2-6, and the gate routing line 5 disposed in a direction in which the fingers 2-1 to 2-6 are arranged, and connected to the individual gate fingers 2-1 to 2-6.

In this configuration, the gate fingers 2-1 to 2-6 are arranged in one direction, each of the gate fingers is disposed so as to be adjacent to the corresponding one of the drain electrodes 3-1 to 3-3 and the corresponding one of the source electrodes 4-1 to 4-4 alternately, and the gate fingers have non-uniform gate head lengths. In particular, each of the gate fingers 2-1 to 2-6 has a longer gate head length as it is closer to the transistor center portion, and a shorter gate head length as it is closer to any one of the transistor end portions. In this way, by making the gate head lengths in the respective gate fingers 2-1 to 2-6 non-uniform, the RF drain currents can be uniform.

As a result, a difference between output terminal impedances in the plurality of respective finger structures is reduced, and therefore deterioration in efficiency of the high frequency power amplifier using the semiconductor device 1 can be suppressed.

Second Embodiment

Figure 7:
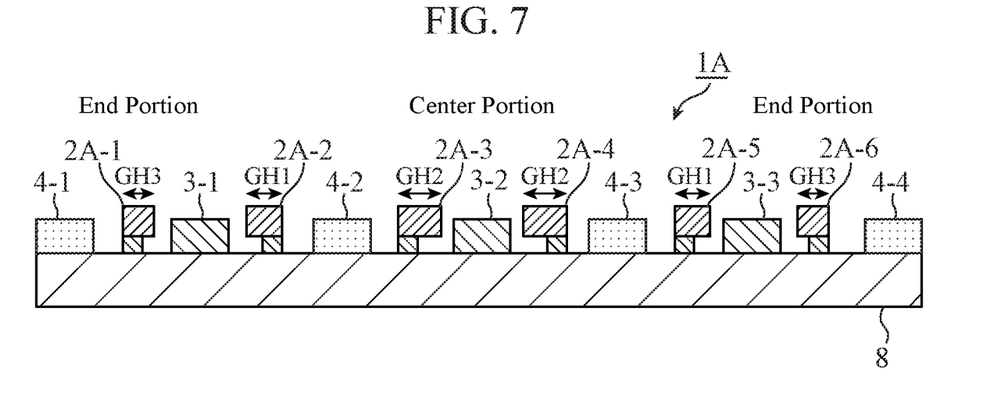
FIG. 7 is a cross-sectional view illustrating a configuration of a semiconductor device according to a second embodiment of the present invention.

FIG. 7 is a cross-sectional view illustrating a configuration of a semiconductor device 1A according to a second embodiment of the present invention, and illustrates a cross section of the semiconductor device 1A taken along line A-A in FIG. 1. In FIG. 7, the same components as those in FIG. 2 are denoted by the same reference numerals, and description thereof is omitted.

In the semiconductor device 1 according to the first embodiment, the gate head has a T-shape extending toward both the side of the corresponding drain electrode and the side of the corresponding source electrode. However, in the semiconductor device 1A according to the second embodiment, a gate head has a F shape extending only toward the side of a corresponding drain electrode. Even in the F-shaped gate head structure, by making the gate head lengths non-uniform, a balance of Cgs and Cgd in each of the plurality of finger structures can be changed.

In the semiconductor device 1A, the gate head length of each of the gate fingers 2A-1 and 2A-6, the gate head length of each of the gate fingers 2A-2 and 2A-5, and the gate head length of each of the gate fingers 2A-3 and 2A-4 are different from one another and non-uniform. In particular, each of the gate fingers 2A-1 to 2A-6 has a longer gate head length as it is closer to the transistor center portion, and a shorter gate head length as it is closer to any one of the transistor end portions.

As illustrated in FIG. 7, a gate head length GH2 of the gate finger 2A-3 adjacent to the transistor center portion is the longest, a gate head length GH1 of the gate finger 2A-2 adjacent thereto is the second longest, and a gate head length GH3 of the gate finger 2A-1 at the transistor end portion is shorter than GH1. The same applies to the gate fingers 2A-4 to 2A-6. When all the gate head lengths of the conventional multi-finger transistor are constantly GH1, in the semiconductor device 1A, an average value of the gate head lengths of the gate fingers 2A-1 to 2A-6 is set to GH1. That is, the average value of the gate head lengths is (GH1+GH2+GH3)×2/6=GH1.

The finger structure at the transistor center portion includes the gate fingers 2A-3 and 2A-4 having long gate head lengths, and therefore has the largest Cgs and Cgd. Since each of the gate fingers has a shorter gate head length as it is closer to any one of the transistor end portions, Cgs and Cgd in the corresponding finger structure gradually decrease. As a result, an imbalance in input terminal impedances among the six respective finger structures is absorbed, and the input terminal impedances in all the finger structures are uniform.

When the input terminal impedances are uniform, the RF drain currents output from the respective six finger structures also are uniform to reduce a difference between output terminal impedances in the respective finger structures. Therefore, deterioration in efficiency of the high frequency power amplifier using the semiconductor device 1A can be suppressed.

In addition, when the average value of the gate head lengths of the gate fingers 2A-1 to 2A-6 is GH1, the semiconductor device 1A can maintain the same gain as the conventional multi-finger transistor in which the gate head length is GH1.

As described above, in the semiconductor device 1A according to the second embodiment, each of the gate fingers 2A-1 to 2A-6 has a F-shaped gate head structure in which the shape of the gate head extends toward the side of the corresponding drain electrode. In this configuration, each of the gate fingers has a longer gate head length extending toward the side of the corresponding drain electrode as it is closer to the transistor center portion, and a shorter gate head length extending toward the side of the corresponding drain electrodes as it is closer to any one of the transistor end portions. In this way, by making the gate head lengths in the gate fingers 2A-1 to 2A-6 non-uniform, the RF drain currents can be uniform. As a result, a difference between output terminal impedances in the respective gate fingers 2A-1 to 2A-6 is reduced, and therefore deterioration in efficiency of the high frequency power amplifier using the semiconductor device 1A can be suppressed.

Third Embodiment

Figure 8:
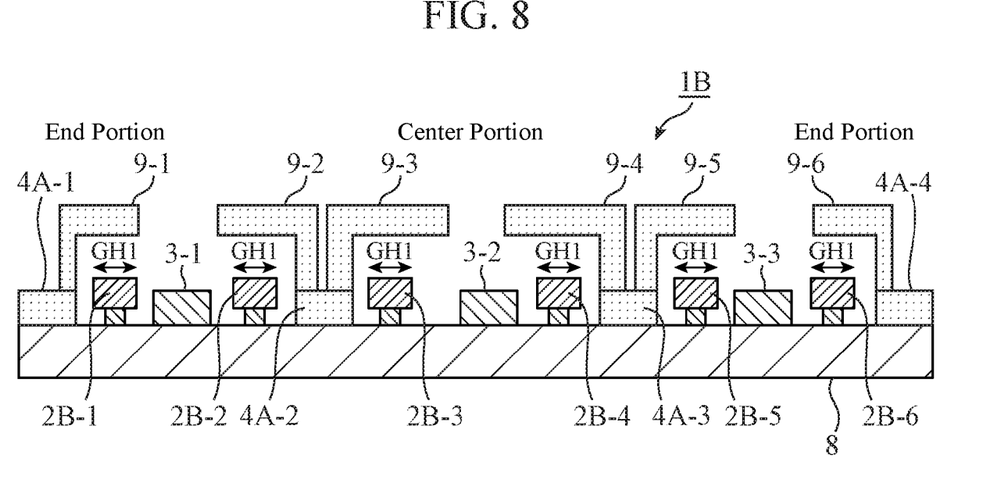
FIG. 8 is a cross-sectional view illustrating a configuration of a semiconductor device according to a third embodiment of the present invention.

FIG. 8 is a cross-sectional view illustrating a configuration of a semiconductor device 1B according to a third embodiment of the present invention, and illustrates a cross section of the semiconductor device 1B taken along line A-A in FIG. 1. In FIG. 8, the same components as those in FIG. 2 are denoted by the same reference numerals, and description thereof is omitted.

In the semiconductor device 1 according to the first embodiment and the semiconductor device 1A according to the second embodiment, the gate head lengths are non-uniform, but in the semiconductor device 1B according to the third embodiment, plate lengths of source field plates (hereinafter referred to as SFP) 9-1 to 9-6 are non-uniform. Even by making the plate lengths of the SFPs 9-1 to 9-6 non-uniform, a balance of Cgs and Cgd in each of the plurality of finger structures can be changed.

Gate fingers 2B-1 to 2B-6 are strip-shaped electrodes arranged in one direction, each of the gate fingers 2-1 to 2-6 is disposed so as to be adjacent to a corresponding drain electrode and a corresponding source electrode alternately, similarly to the gate fingers 2-1 to 2-6 described in the first embodiment. Note that the gate head lengths of the gate fingers 2B-1 to 2B-6 are all GH1.

In FIG. 8, each of source electrodes 4A-1 to 4A-4 is a strip-shaped electrode disposed so as to be adjacent to the corresponding one or two of the gate fingers 2B-1 to 2B-6. Each of the SFPs 9-1 to 9-6 is a member that is provided for the corresponding one of the source electrodes 4A-1 to 4A-4 and extends from the corresponding one of the source electrodes 4A-1 to 4A-4 toward the corresponding one of the sides of the gate fingers 2B-1 to 2B-6.

The source electrode 4A-1 has the SFP 9-1 extending toward the side of the gate finger 2B-1. The source electrode 4A-2 has the SFP 9-2 extending toward the side of the gate finger 2B-2 and the SFP 9-3 extending toward the side of the gate finger 2B-3. The source electrode 4A-3 has the SFP 9-4 extending toward the side of the gate finger 2B-4 and the SFP 9-5 extending toward the side of the gate finger 2B-5. The source electrode 4A-4 has the SFP 9-6 extending toward the side of the gate finger 2B-6.

As illustrated in FIG. 8, the plate lengths of the SFP 9-3 and SFP 9-4 adjacent to the transistor center portion are the longest, and the plate lengths of the SFP 9-2 and SFP 9-5 adjacent thereto are the second longest, and the plate lengths of the SFP9-1 and SFP9-6 at the respective transistor end portions are the shortest.

The finger structure at the transistor center portion includes the SFPs 9-3 and 9-4 having long plate lengths, and therefore has the largest Cgs and Cgd. Since each of the SFPs has a shorter plate length as it is closer to any one of the transistor end portions, Cgs and Cgd in the corresponding finger structure gradually decrease. As a result, an imbalance in input terminal impedances among the six respective finger structures is absorbed, and the input terminal impedances in all the finger structures are uniform.

When the input terminal impedances are uniform, the RF drain currents output from the six respective finger structures also are uniform to reduce a difference between output terminal impedances in the respective finger structures. Therefore, deterioration in efficiency of the high frequency power amplifier using the semiconductor device 1B can be suppressed.

As described above, the semiconductor device 1B according to the third embodiment includes the SFPs 9-1 to 9-6 each of which is provided for the corresponding one of the source electrodes 4A-1 to 4A-4 and extends from the corresponding one of the source electrodes 4A-1 to 4A-4 toward the corresponding one of the sides of the gate fingers 2B-1 to 2B-6. In particular, each of the SFPs 9-1 to 9-6 has a longer plate length as it is closer to the transistor center portion, and a shorter plate length as it is closer to any one of the transistor end portions. In this way, by making the plate lengths of the SFPs 9-1 to 9-6 non-uniform, the RF drain currents can be uniform. As a result, a difference between output terminal impedances in the plurality of respective finger structures is reduced, and therefore deterioration in efficiency of the high frequency power amplifier using the semiconductor device 1B can be suppressed.

Note that in the present invention, it is possible to freely combine the embodiments to each other, modify any constituent element in each of the embodiments, or omit any constituent element in each of the embodiments within the scope of the invention.

INDUSTRIAL APPLICABILITY

The semiconductor device according to the present invention can suppress deterioration in efficiency by reducing a difference between output terminal impedances in the plurality of respective gate electrodes, and therefore can be used for a high frequency power amplifier.

REFERENCE SIGNS LIST 1, 1A, 1B: Semiconductor device, 2-1 to 2-6, 2A-1 to 2A-6, 2B-1 to 2B-6: Gate finger, 3-1 to 3-3: Drain electrode, 3a, 5a: Line, 4-1 to 4-4, 4A-1 to 4A-4: Source electrode, 5: Gate routing line, 6-1, 6-2: Source pad, 6a, 6b: Via hole, 7-1 to 7-4: Air bridge, 8: Semiconductor layer, 9-1 to 9-6: Source field plate (SFP).

The invention claimed is:

1. A semiconductor device comprising:
a plurality of drain electrodes;
a plurality of source electrodes;
a plurality of gate electrodes that are arranged in one direction and each of which is disposed so as to be adjacent to a corresponding one of the drain electrodes and a corresponding one of the source electrodes alternately; and
a gate routing line disposed in the direction in which the gate electrodes are arranged, and connected to the plurality of gate electrodes, wherein
the plurality of gate electrodes has non-uniform gate head lengths.

2. The semiconductor device according to claim 1, wherein
each of the plurality of gate electrodes has a longer gate head length as it is closer to a transistor center portion, and a shorter gate head length as it is closer to any one of transistor end portions.

3. The semiconductor device according to claim 1, wherein
each of the plurality of gate electrodes has a F-shaped gate head structure in which a gate head shape extends toward a side of the corresponding one of the drain electrodes.

4. The semiconductor device according to claim 3, wherein
each of the plurality of gate electrodes has a longer gate head length extending toward the side of the corresponding one of the drain electrodes as it is closer to a transistor center portion, and a shorter gate head length extending to the side of the corresponding one of the drain electrodes as it is closer to any one of transistor end portions.

5. A semiconductor device comprising:
a plurality of drain electrodes;
a plurality of source electrodes;
a plurality of gate electrodes that are arranged in one direction and each of which is disposed so as to be adjacent to a corresponding one of the drain electrodes and a corresponding one of the source electrodes alternately;
a gate routing line disposed in the direction in which the gate electrodes are arranged, and connected to the plurality of gate electrodes; and
a plurality of source field plates each of which is provided for a corresponding one of the plurality of source electrodes and each of which extends from the corresponding one of the source electrodes toward a side of a corresponding one of the gate electrodes, wherein
each of the plurality of source field plates has a longer plate length as it is closer to a transistor center portion, and a shorter plate length as it is closer to any one of transistor end portions.

* * * * *

UNITED STATES PATENT AND TRADEMARK OFFICE
CERTIFICATE OF CORRECTION

PATENT NO. : 10,741,700 B2
APPLICATION NO. : 16/604092
DATED : August 11, 2020
INVENTOR(S) : Yutaro Yamaguchi et al.

Page 1 of 1

It is certified that error appears in the above-identified patent and that said Letters Patent is hereby corrected as shown below:

In the Claims

In Claim 3, at Column 10, Line 3, please replace "F-shaped" with --Γ-shaped--.

Signed and Sealed this
Tenth Day of November, 2020

Andrei Iancu
*Director of the United States Patent and Trademark Office*